(12) United States Patent
Gardner et al.

(10) Patent No.: US 6,410,409 B1
(45) Date of Patent: Jun. 25, 2002

(54) IMPLANTED BARRIER LAYER FOR RETARDING UPWARD DIFFUSION OF SUBSTRATE DOPANT

(75) Inventors: Mark I. Gardner, Cedar Creek; Robert Dawson, Austin; H. Jim Fulford, Jr., Austin; Frederick N. Hause, Austin; Mark W. Michael, Cedar Park; Bradley T. Moore; Derick J. Wristers, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/741,799

(22) Filed: Oct. 31, 1996

(51) Int. Cl.⁷ .............................................. H01L 21/265
(52) U.S. Cl. ..................... 438/526; 438/527; 438/528
(58) Field of Search ................. 438/514, 515, 438/526, 527, 528, 530, 305, 199, 370, FOR 158, FOR 160, FOR 161, 301, 358, 225–228; 148/DIG. 82, DIG. 83, DIG. 3, DIG. 76

(56) References Cited

U.S. PATENT DOCUMENTS

| | | | | |
|---|---|---|---|---|
| 4,053,925 A | * | 10/1977 | Burr et al. | 438/199 |
| 4,584,026 A | * | 4/1986 | Wu et al. | 438/530 |
| 5,145,794 A | * | 9/1992 | Kase et al. | 438/528 |
| 5,389,563 A | * | 2/1995 | Kuroi et al. | 438/526 |
| 5,514,902 A | * | 5/1996 | Kawasaki et al. | 257/607 |
| 5,578,507 A | * | 11/1996 | Kuroi | 438/526 |
| 5,654,209 A | * | 8/1997 | Kato | 438/528 |
| 5,654,210 A | * | 8/1997 | Aronowitz et al. | 438/526 |

OTHER PUBLICATIONS

Silicon Processing for the VLSI Era—vol. 2: Process Integration, by Stanley Wolf, published by Lattice Press, Sunset Beach, CA, 1990, pp. 72–75.

Silicon Processing for the VLSI Era—vol. 3: The Submicron MOSFET, by Stanley Wolf, published by Lattice Press, Sunset Beach, CA, 1995, pp. 311–313, 397–404, 499–502, 528–531, 554–555, 641–642, and 648–661.

* cited by examiner

*Primary Examiner*—Savitri Mulpuri
(74) *Attorney, Agent, or Firm*—Skjerven Morrill LLP

(57) ABSTRACT

Boron forming a deep P+ layer within a semiconductor substrate upwardly diffuses during subsequent heat treatment operations such as annealing. A method for retarding this upward diffusion of boron includes implanting nitrogen to form a nitrogen barrier layer near the upper boundary of the P+ layer and well below transistor source/drain regions. One embodiment includes a lightly doped epitaxial layer formed upon an underlying P+ substrate. In another embodiment, a deep boron implant forms a P+ layer within a P− substrate, and affords many of the advantages of an epitaxial layer without actually requiring such an epitaxial layer. The nitrogen implant is performed at a preferred energy of 1–3 MeV to form the implanted nitrogen barrier layer at a depth in the range of 1–5 microns. Oxygen may also be implanted to form a diffusion barrier layer to retard the upward diffusion of arsenic or phosphorus forming a deep N+ layer.

37 Claims, 7 Drawing Sheets

IMPLANTED BARRIER LAYER FOR RETARDING UPWARD DIFFUSION OF SUBSTRATE DOPANT

BACKGROUND OF THE INVENTION

1. Field of the Invention

The present invention relates to the manufacture of semiconductor structures, and more particularly to the reduction of dopant diffusion within regions of a semiconductor substrate.

2. Description of the Related Art

Modern high performance CMOS processes frequently make use of a heavily-doped P-type substrate (a P+ substrate) with a lightly-doped P-type epitaxial layer (a P− epitaxial layer) grown upon the substrate. N-wells and P-wells are then formed within the epitaxial layer and P-channel and N-channel transistor structures are then formed within the respective wells. Epitaxial layers are very beneficial for several reasons. They can be grown nearly defect free and typically of much higher quality than the underlying substrate. Moreover, a more heavily-doped substrate may be used with an epitaxial layer because the substrate need never be counter-doped to achieve a region of opposite conductivity type within the substrate. For example, a more heavily-doped P+ substrate may be used with a P− epitaxial layer because the substrate need never be counter-doped to achieve an N-type region within the substrate. With an epitaxial layer, the N-type regions are all formed within the more lightly-doped P− epitaxial layer, rather than within the underlying P+ substrate. Furthermore, a heavily doped P+ substrate provides a desirable gettering effect for contaminants. Even though substrates with an epitaxial layer may cost twice as much as substrates without such an epitaxial layer, these advantages frequently outweigh the increased cost.

However, the use of such a heavily doped substrate may result in significant upward diffusion of the substrate dopant into the epitaxial layer, where it may affect transistor characteristics. This upward diffusion is particularly problematic with boron-doped P+ substrates, since boron is the most rapidly diffusing species that is used in semiconductor processing. Nevertheless, the same upward diffusion may also be problematic when using heavily-doped N-type substrates (N+ substrates) doped with arsenic or phosphorus. With an epi-substrate, the dopant forming the heavily-doped substrate is subjected to the cumulative heat treatment of the entire process since the epi-substrate constitutes the starting material for the process and the dopant is present within the substrate even for the initial high-temperature processing steps. As a result, the dopant, especially boron, may diffuse significantly toward the surface of the substrate and interfere with desired transistor characteristics.

It is frequently desired to make epitaxial layers as thin as possible. For example, in a process using a P+ substrate with a P− epitaxial layer, the transistor structures formed upon such a substrate are desired to be close to the heavily-doped substrate to reduce the N-well, P-well, and substrate parasitic resistances, which consequently improves device performance such as latch-up immunity. But by placing the boron dopant forming the P+ substrate that much closer (vertically) to the transistor structures, the likelihood of boron upward diffusion reaching the transistor regions and causing unwanted effects is magnified.

What is needed is a method for reducing upward diffusion of dopants within the semiconductor substrate, which would allow thinner epitaxial layers to be used with heavily-doped substrates, and more generally allow closer spacing of a heavily-doped layer to overlying transistor structures. A thinner epitaxial layer results in lower parasitic resistances, and hence higher performance transistors, while the reduced upward diffusion lessens the negative interaction with transistor structures formed upon the substrate. Moreover, a thinner epitaxial layer also results in less expensive substrates.

SUMMARY OF THE INVENTION

The upward diffusion of dopant within a heavily-doped layer of a semiconductor body, such as a semiconductor substrate, may be retarded by implanting a material to form a barrier layer beneath the top surface of the semiconductor body. The material is implanted to a depth below the structures to be protected, such as source/drain regions of transistor structures formed within the substrate. The implanted material may be either nitrogen or oxygen. In various embodiments, the material may be implanted very early in the process flow, such as after an initial "cap" oxide, or alternatively may be implanted at a variety of points in the process flow, including after gate material deposition, gate electrode formation, or source/drain region formation. The implant need not be performed early in the process flow. The barrier layer implant is preferably performed using a high acceleration potential of 1–3 MeV, and results in a barrier layer formed at a depth from 1–5 microns below the top surface.

In one embodiment of the invention, the semiconductor body includes a heavily-doped substrate upon which a lightly-doped epitaxial layer is formed, for example a boron-doped P+ substrate with a P− epitaxial layer. In another embodiment, the semiconductor body includes a lightly-doped substrate having an implanted heavily-doped layer separated from the top surface of the semiconductor body. Such an implanted heavily-doped layer affords many of the advantages of using an epitaxial layer on a heavily-doped substrate without the increased cost of growing the epitaxial layer.

The heavily-doped layer may be either N-type, for example using a phosphorus or arsenic dopant, or P-type, for example using a boron dopant. In various embodiments the barrier layer may be formed to reside substantially within the heavily doped layer, to reside partially within the heavily-doped layer and partially between the heavily-doped layer and the top surface, or to reside substantially between the heavily-doped layer and the top surface.

Moreover, in various embodiments the barrier layer implantation may be performed non-selectively which results in an implanted barrier layer which is continuous across the semiconductor body. Alternatively, the barrier layer implantation may be performed selectively into certain regions of the semiconductor body which results in a implanted barrier layer which is discontinuous across the semiconductor body. These certain regions may include a well region of a first conductivity type and exclude well regions of a second conductivity type. For example, the barrier layer implantation may be performed into N-wells but not P-wells.

In one particular embodiment of the present invention, a method for retarding upward diffusion of a dopant within a semiconductor body includes: (1) providing a semiconductor body having a top surface and a heavily-doped layer beneath and separated from the top surface, the heavily-doped layer including a first dopant; (2) forming a transistor gate electrode upon the semiconductor body; (3) forming a transistor source/drain region within the semiconductor body; and (4) implanting a material into the semiconductor body to form a barrier layer of the material beneath and separated from the top surface and at a greater depth than the source/drain region, for retarding the upward diffusion of the first dopant.

In another embodiment of the present invention, a method for retarding upward diffusion of a dopant within a semiconductor body includes: (1) providing a semiconductor body having a top surface and a heavily-doped P+ layer beneath and separated from the top surface, the heavily-doped P+ layer including boron and having an upper boundary; (2) forming a transistor gate electrode upon the semiconductor body; (3) forming a transistor source/drain region within the semiconductor body; and (4) implanting nitrogen into the semiconductor body to form a nitrogen barrier layer beneath and separated from the top surface and at a greater depth than the source/drain region, the barrier layer in close proximity with the upper boundary for retarding the upward diffusion of boron from the heavily-doped P+ layer.

In another embodiment of the present invention, a method of retarding upward diffusion of boron within a semiconductor body includes: (1) providing a semiconductor body having a top surface; (2) forming a transistor gate electrode upon the semiconductor body; (3) forming a transistor source/drain region within the semiconductor body; (4) implanting boron into the semiconductor body to form a heavily-doped P+ layer beneath and separated from the source/drain region; (5) implanting nitrogen into the semiconductor body to form a barrier layer between the heavily-doped P+ layer and the source/drain region, the barrier layer for retarding the upward diffusion of boron forming the heavily-doped P+ layer; and (6) annealing the semiconductor body after both implanting steps.

In one particular embodiment of the present invention, a semiconductor structure includes: (1) a semiconductor body having a top surface and a heavily-doped layer beneath and separated from the top surface, the heavily-doped layer including a first dopant; (2) a transistor gate electrode formed upon the semiconductor body; (3) a transistor source/drain region formed within the semiconductor body; and (4) a barrier layer formed of a material implanted into the semiconductor body beneath and separated from the top surface and at a greater depth than the source/drain region for retarding the upward diffusion of said first dopant.

Other embodiments, features, and advantages of the present invention may be appreciated by careful review of the detailed description below.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION OF THE PREFERRED EMBODIMENTS

Figure 1A:
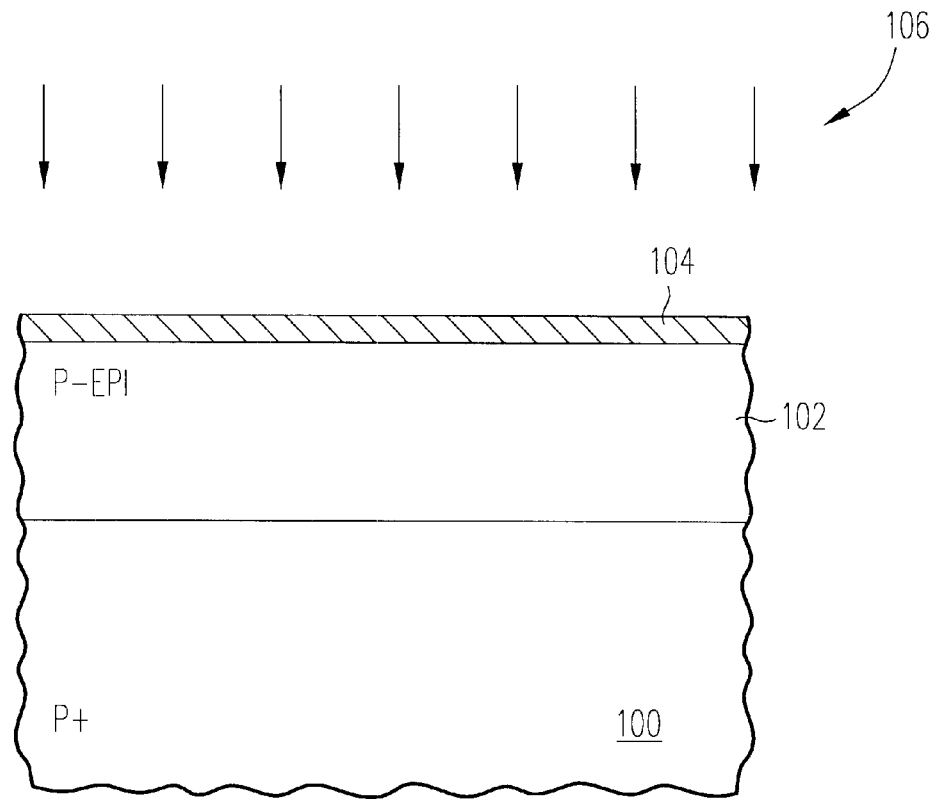
FIGS. 1A–1B are cross-sectional views of a semiconductor process flow in accordance with an embodiment of the current invention.
Figure 1B:
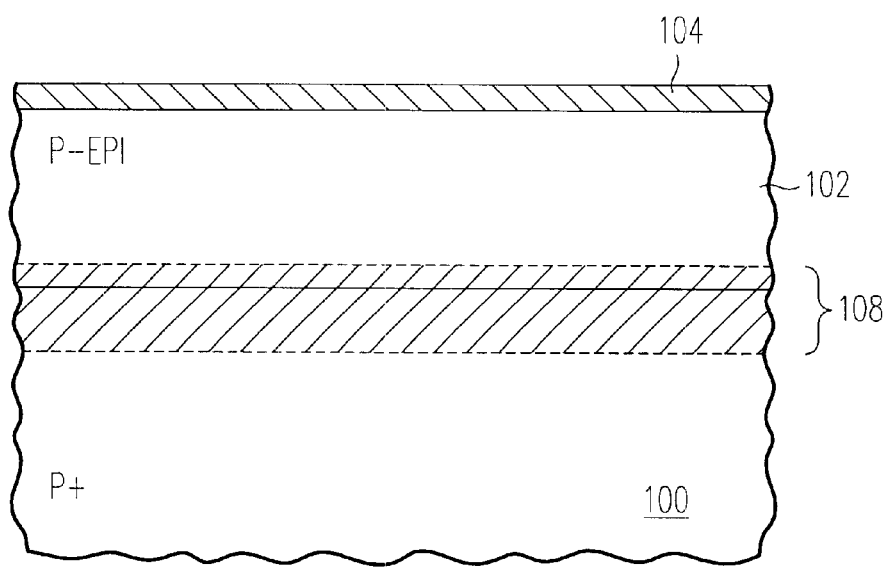

One embodiment of the present invention is illustrated in FIGS. 1A–1B in which an implanted nitrogen barrier layer is formed beneath the top surface of an epitaxial layer to retard the upward diffusion of boron from the underlying heavily-doped substrate. Referring to FIG. 1A, a semiconductor body includes a P+ substrate 100 and a P– epitaxial layer 102 formed upon the P+ substrate 100. The P– epitaxial layer 102 is preferably 4 microns thick. An implant oxide 104 previously formed (by growth or deposition) upon the P– epitaxial layer 102 functions as a "cap" oxide to de-channel implanted ions, as is well known in the art. The implant oxide 104 may also function to trap contaminants in an implant beam, as is well known in the art, when using other than a "clean beam" implant. The implant oxide 104 is preferably 50–300 Å thick.

Continuing with the process sequence, a nitrogen implant 106 is next performed non-selectively (as a blanket implant) into the semiconductor body as shown in FIG. 1A. The resulting structure is shown in FIG. 1B, and includes an implanted nitrogen barrier layer 108 formed, for this embodiment, in close proximity to the boundary between the P– epitaxial layer 102 and the P+ substrate 100. The nitrogen implant 106 may be performed at an energy in the range of 1–3 MeV at a dose in the range of $1 \times 10^{13}$ to $5 \times 10^{15}$ atoms/cm$^2$, to achieve the placement of the nitrogen barrier layer 108 at a depth in the range of 1–5 microns. The nitrogen barrier layer 108 may alternatively be formed at any of a variety of different depths. For example, the nitrogen barrier layer 108 may reside within the P– epitaxial layer 102, may reside partially within the P– epitaxial layer 102 and partially within the P+ substrate 100 (as shown in FIG. 1B), or may reside completely within the P+ substrate 100. Moreover, the nitrogen implant 106 may alternatively be performed without an implant oxide 104.

Continuing with the process sequence, an anneal is next performed to repair lattice damage caused by the nitrogen implant 106. Such an anneal is preferably performed using rapid thermal processing (RTP) and may be performed at a temperature in the range of 850–1200° C. for a time duration in the range of 10–60 seconds. Alternatively, a furnace anneal may also be employed.

The nitrogen barrier layer 108 is formed below the top surface of the P– epitaxial layer 102, but moreover is formed advantageously at a depth below the source/drain regions of transistor structures. Even if the nitrogen implant 106 is performed before formation of the source/drain regions, the depth of the nitrogen barrier layer 108 is advantageously below the source/drain regions once formed.

Figure 7:
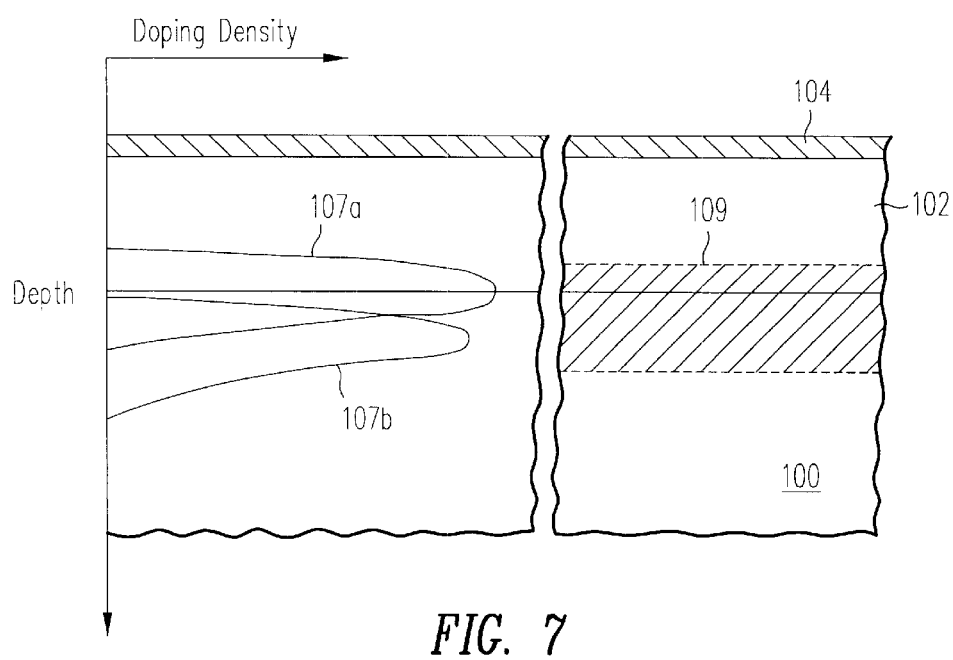
FIG. 7 is a cross-sectional view of a particular structure in a semiconductor process flow in accordance with another embodiment of the current invention.

As an alternative embodiment, a dual implant may be performed to widen the implanted nitrogen barrier layer formed within the substrate. For example, FIG. 7 shows a similar structure to that shown in FIG. 1B, including a P+ substrate 100, a P– epitaxial layer 102, and an implant oxide 104. A nitrogen barrier layer 109 is shown as formed by two different nitrogen implant operations (not shown), each at a different energy. Implant profile 107a is formed by a first implant (not shown) having a first energy, while implant profile 107b is formed by a second implant (not shown) having a second energy higher than the first energy. Of course, these two implants may be performed in either order, and could be performed at different points in the process flow. For example, the deeper implant may be performed early in the process flow, such as after the implant oxide 104 is formed, while the shallower implant may be performed much later, such as after the source/drain formation. The combined effect of these two implant profiles 107a and 107b is a wider nitrogen barrier layer 109 than the previous nitrogen barrier layer 108 shown in FIG. 1B using a single nitrogen implant.

The nitrogen implant 106 may be performed after formation of an implant oxide 104 (as shown), or may alternatively be performed after formation of field regions (as in field oxidation or trench formation), after deposition of gate material (such as polysilicon or refractory metal deposition), after formation of the gate electrodes (such as patterning and etching to form polysilicon gate electrodes), or after formation of the source/drain regions (such as implantation and/or annealing of source/drain dopants), as will be discussed further below.

Figure 2A:
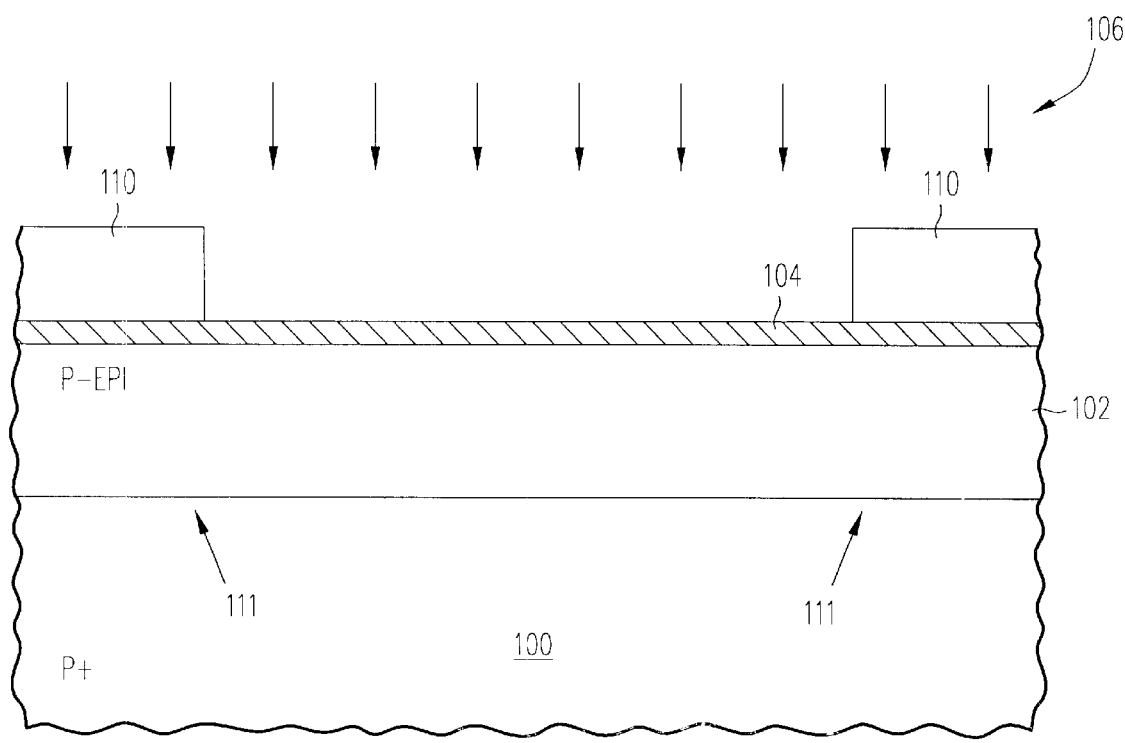
FIGS. 2A–2B are cross-sectional views of a semiconductor process flow in accordance with another embodiment of the current invention.
Figure 2B:
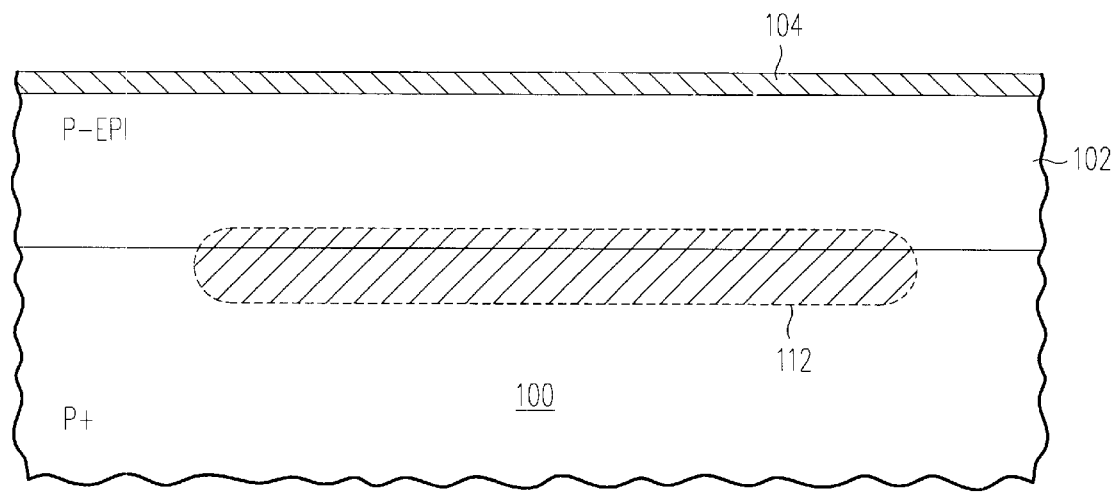

Another embodiment of the present invention is illustrated in FIGS. 2A–2B in which a nitrogen implant is performed selectively by use of a patterned masking layer to form a discontinuous implanted nitrogen barrier layer within the semiconductor body. Referring to FIG. 2A, a semiconductor body includes a P+ substrate 100, a P epitaxial layer 102 formed upon the P+ substrate 100, and an implant oxide 104, as before. A patterned masking layer 110, such as a photoresist layer, is shown disposed upon the implant oxide 104 and is preferably 40,000–50,000 Å (4–5 microns) thick. Patterning and etching of such a masking layer is well known in the art.

Continuing with the process sequence, a nitrogen implant 106 is next performed into the semiconductor body as shown in FIG. 2A. The patterned masking layer 110 is thick enough to block the penetration of nitrogen into regions of the semiconductor body (for example, regions 111) disposed below the patterned masking layer 110. The resulting structure is shown in FIG. 2B, and includes an implanted nitrogen barrier layer 112 formed in close proximity to the boundary between the P− epitaxial layer 102 and the P+ substrate 100. The implanted nitrogen barrier layer 112 is formed only within regions of the semiconductor body not protected by the patterned masking layer 110, and is thus discontinuous across the semiconductor body. The nitrogen barrier layer 112 may alternatively be formed at any of a variety of different depths. For example, the implanted nitrogen barrier layer 112 may reside completely within the P− epitaxial layer 102, may reside partially within the P− epitaxial layer 102 and partially within the P+ substrate 100 (as shown in FIG. 2B), or may reside completely within the P+ substrate 100. Moreover, the nitrogen implant 106 may alternatively be performed without an implant oxide 104.

As before, the nitrogen implant 106 may be performed after formation of an implant oxide 104 (as shown), or may alternatively be performed after formation of field regions, after deposition of gate material, after formation of the gate electrodes, or after formation of the source/drain regions. In each case, the patterned masking layer 110 is formed as shown in FIG. 2A to mask the high energy nitrogen implant and to result in formation of a nitrogen barrier layer only within certain regions of the semiconductor body. These certain regions may include a well region of a first conductivity type and exclude well regions of a second conductivity type. For example, the barrier layer implantation may be performed into N-wells but not P-wells.

Continuing with the process sequence, an anneal is next performed to repair lattice damage caused by the nitrogen implant 106. Such an anneal is preferably performed using rapid thermal processing (RTP) and may be performed at a temperature in the range of 850–1200° C. for a time duration in the range of 10–60 seconds. Alternatively, a furnace anneal may also be employed.

Figure 3A:
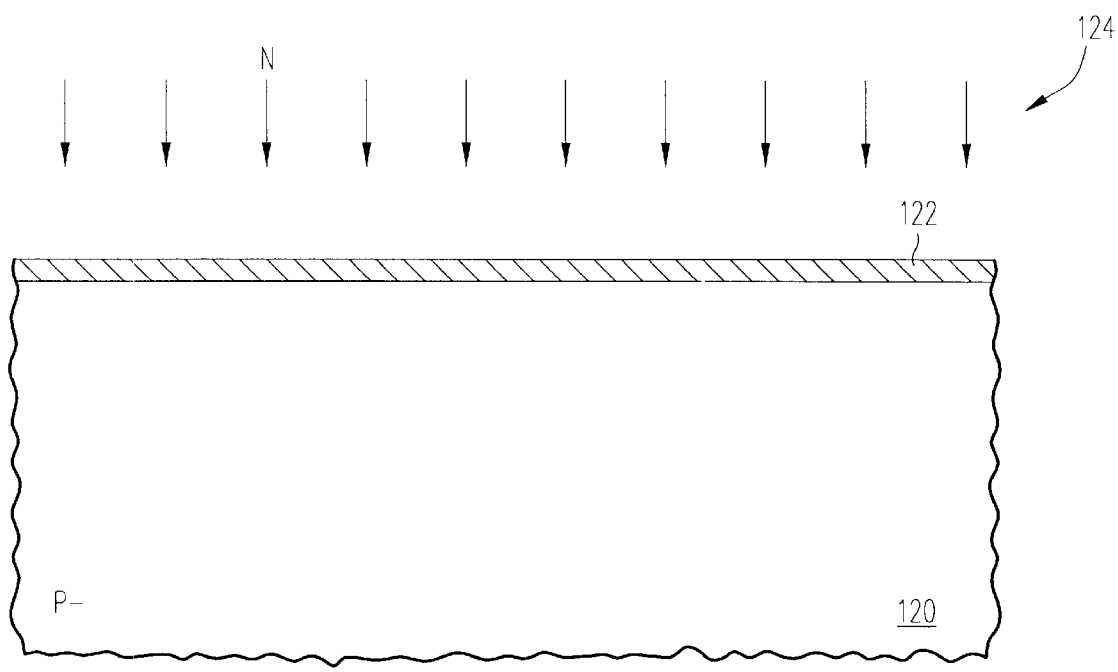
FIGS. 3A–3C are cross-sectional views of a semiconductor process flow in accordance with another embodiment of the current invention.
Figure 3B:
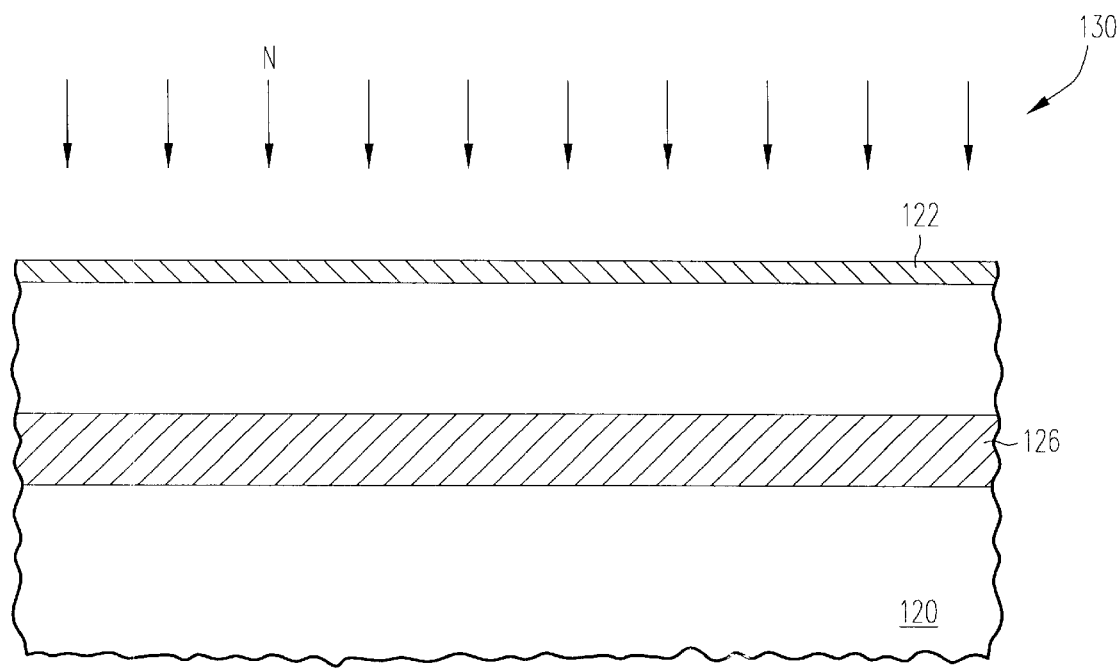
Figure 3C:
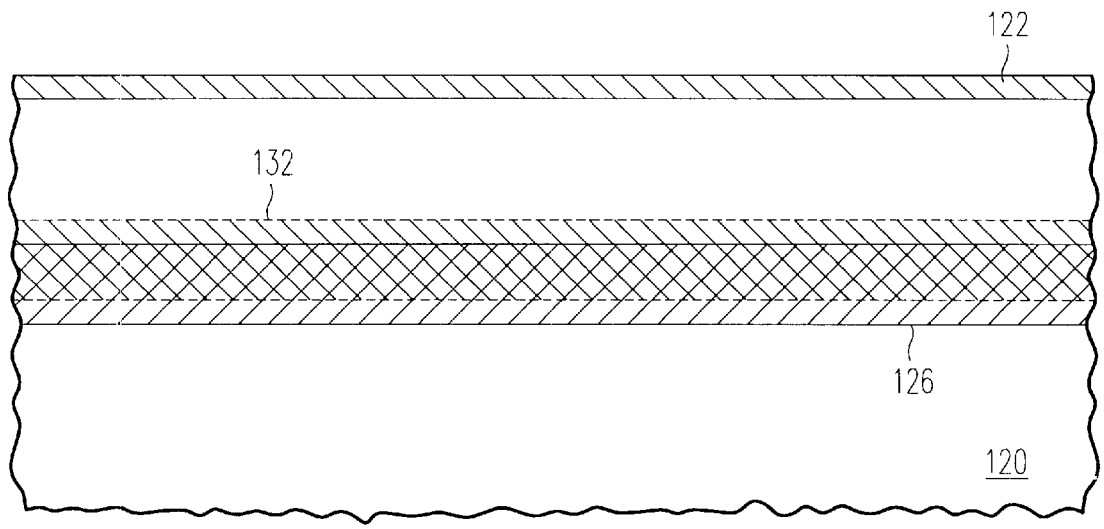

Another embodiment of the present invention is illustrated in FIGS. 3A–3C in which a boron implant is first performed to create a heavily-doped layer within a lightly-doped substrate, followed by a nitrogen implant to form a continuous implanted nitrogen barrier layer within the semiconductor substrate. The defect density of such substrates can be nearly comparable to epitaxial substrates if proper annealing (e.g., hydrogen annealing) is used. Referring to FIG. 3A, a semiconductor body includes a P− substrate 120 and an implant oxide 122. The implant oxide 122 is preferably 50–300 Å thick.

Continuing with the process sequence, a boron implant 124 is next performed into the semiconductor body as shown in FIG. 3A. The resulting structure is shown in FIG. 3B, and includes an implanted boron P+ layer 126 formed below the top surface of the P− substrate 120. The boron implant 124 may be performed at an energy in the range of 1–3 MeV at a dose in the range of $1\times10^{13}$ to $1\times10^{16}$ atoms/cm$^2$ (with a preferred dose of $5\times10^{15}$ atoms/cm$^2$), to achieve the placement of the implanted boron P+ layer 126 at a depth in the range of 1–5 microns.

Continuing with the process sequence, a nitrogen implant 130 is next performed into the semiconductor body as shown in FIG. 3B. The resulting structure is shown in FIG. 3C, and includes a nitrogen barrier layer 132 formed, for this embodiment, in close proximity to the upper boundary of the implanted boron P+ layer 126. The nitrogen barrier layer 132 is formed as a continuous layer across the semiconductor body. The nitrogen barrier layer 132 may alternatively be formed at any of a variety of different depths. For example, the nitrogen barrier layer 132 may reside completely between the top surface and the implanted boron P+ layer 126 (above the implanted boron P+ layer 126), may reside partially between the top surface and the implanted boron P+ layer 126 and partially within the implanted boron P+ layer 126 (as shown in FIG. 2B), or may reside completely within the implanted boron P+ layer 126. Moreover, the nitrogen implant 130 may alternatively be performed without an implant oxide 122.

The boron implant 124 and the nitrogen implant 130 may be performed after formation of an implant oxide 122 (as shown), or may alternatively be performed after formation of field regions, after deposition of gate material, after formation of the gate electrodes, or after formation of the source/drain regions. The nitrogen implant 130 may alternatively precede the boron implant 124. Moreover, the nitrogen implant 130 may be performed early in the process flow (such as after formation of the implant oxide 122) and the boron implant 124 performed much later in the process flow, such as after formation of the source/drain regions.

Continuing with the process sequence, an anneal is next performed to repair lattice damage caused by the boron implant 124 and the nitrogen implant 130. Such an anneal is preferably performed using rapid thermal processing (RTP) and may be performed at a temperature in the range of 850–1200° C. for a time duration in the range of 10–60 seconds. Alternatively, a furnace anneal may also be employed.

If the boron implant 124 is performed after the formation of source/drain regions, including the high temperature anneal for the source/drain regions, then advantageously the boron upward diffusion from the heavily-doped implanted boron P+ layer 126 is reduced because the boron will not have even been present within the P– substrate 120 during many of the high temperature processing steps necessary for transistor formation. The boron implant 124 easily passes through polysilicon gate electrodes, field oxides and source/drain regions without significant implant damage to enable the formation of a heavily doped P+ layer. Moreover, use of such a process affords the opportunity to use less expensive P– wafers as a starting material, rather than more expensive P– epi/P+ wafers.

Figure 4A:
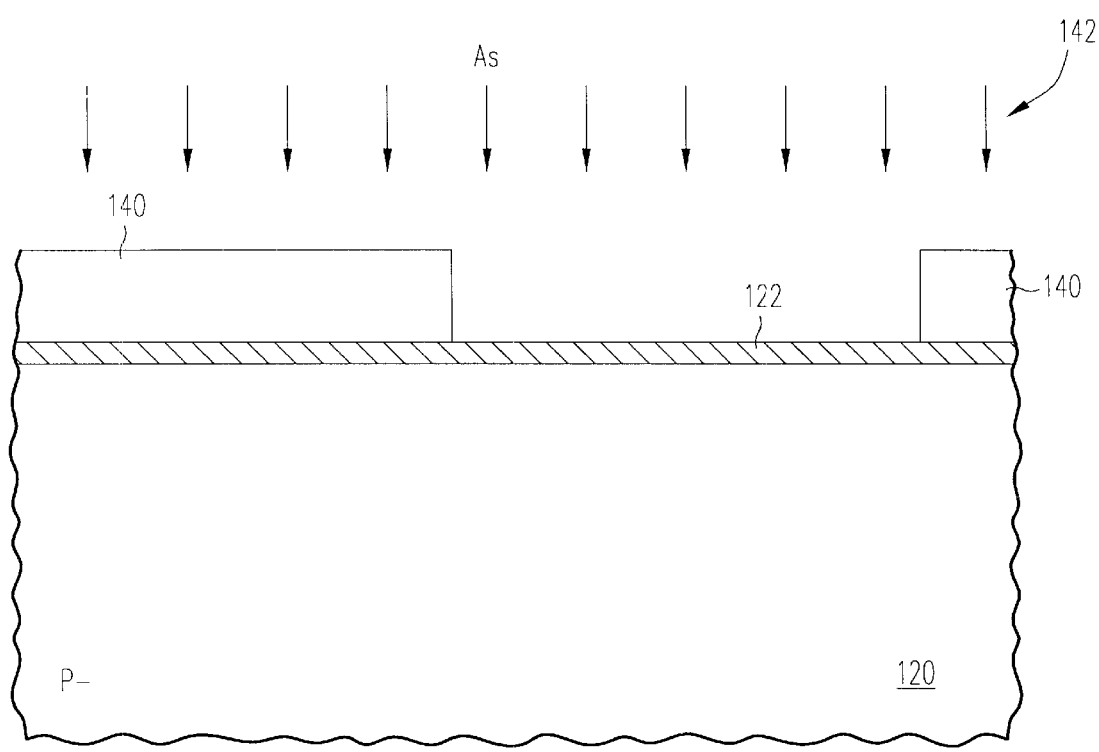
FIGS. 4A–4D are cross-sectional views of a semiconductor process flow in accordance with another embodiment of the current invention.

Alternatively, an lightly-doped N-type wafer may be implanted with arsenic to form a heavily-doped N+ layer below the surface, and a oxygen implant performed to form an implanted oxygen diffusion barrier layer to retard the upward diffusion of arsenic from the heavily-doped N+ layer. Yet another embodiment of the present invention is illustrated in FIGS. 4A–4D in which both a P+ heavily-doped layer and an N+ heavily-doped layer are each formed selectively within a semiconductor body, and a nitrogen implant is performed non-selectively to form a continuous implanted nitrogen barrier layer within the semiconductor body. Referring to FIG. 4A, a semiconductor body includes a P– substrate 120, and an implant oxide 122, as before. A patterned masking layer 140, such as a photoresist layer, is shown disposed upon the implant oxide 122 and is preferably 40,000–50,000 Å thick. Patterning and etching of such a masking layer is well known in the art.

Figure 4B:
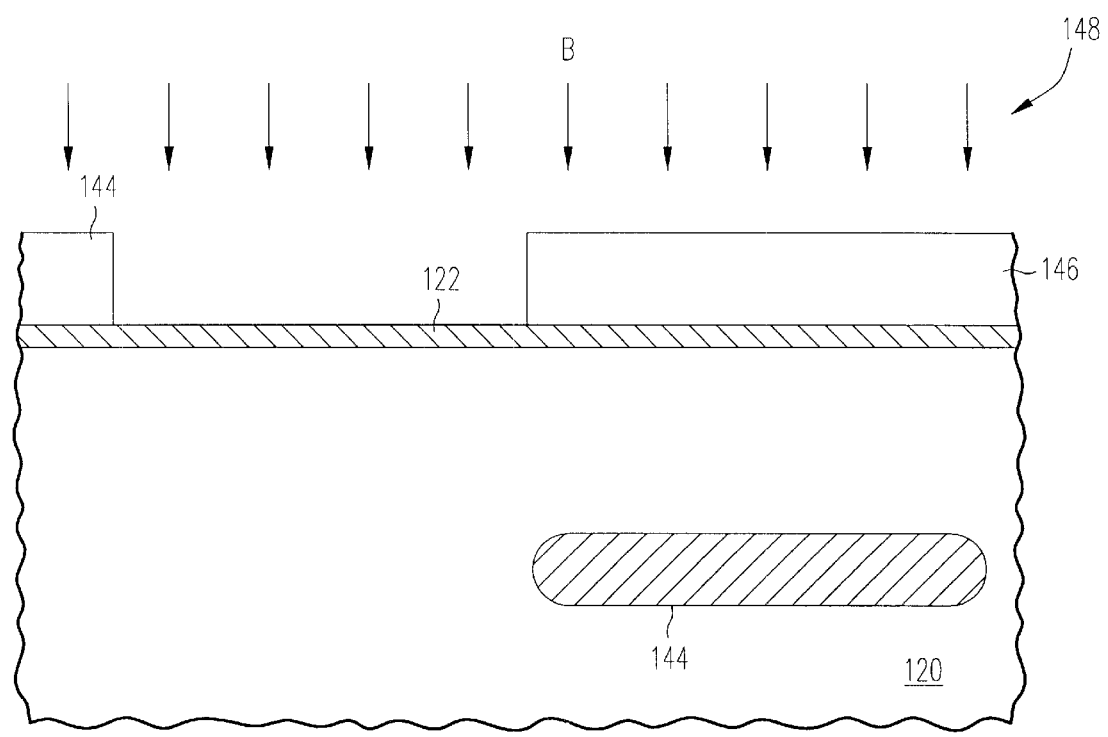

Continuing with the process sequence, an arsenic implant 142 is next performed into the semiconductor body as shown in FIG. 4A. The patterned masking layer 140 is thick enough to block the penetration of arsenic into regions of the semiconductor body disposed below the patterned masking layer 140. The resulting structure is shown in FIG. 4B, and includes an implanted N+ layer 144 formed below the top surface of the P– substrate 120. The implanted N+ layer 144 is formed only within regions of the semiconductor body not protected by the patterned masking layer 140, and is thus discontinuous across the semiconductor body.

Figure 4C:
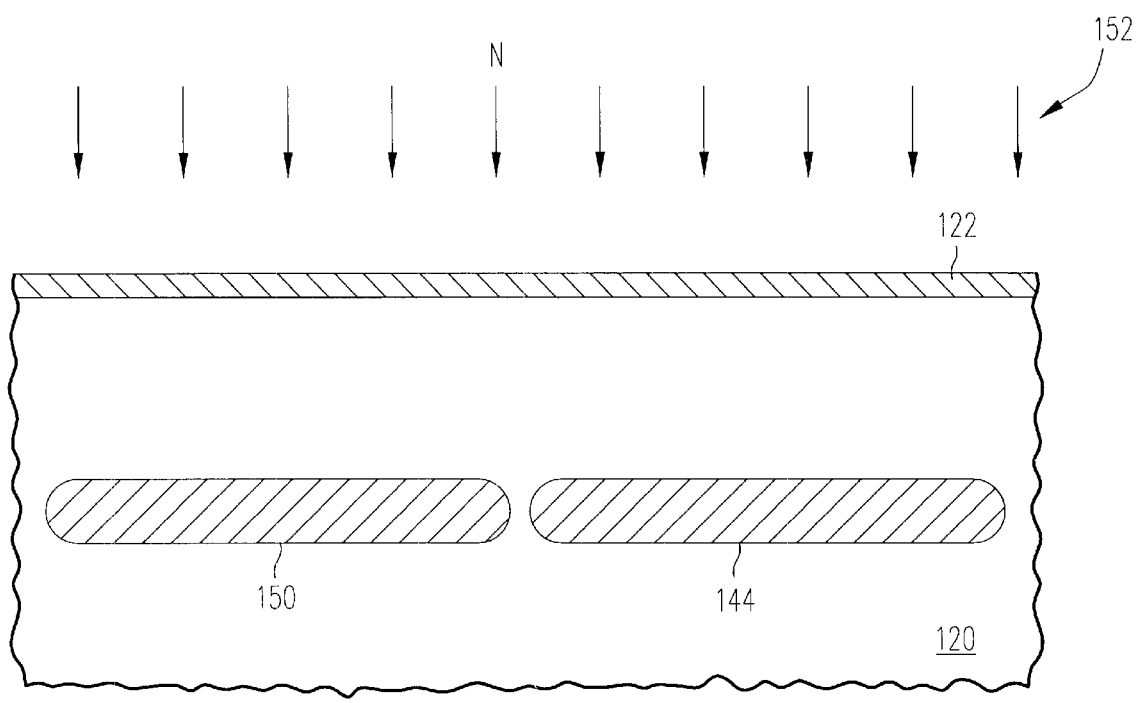

Continuing with the process sequence, the patterned masking layer 140 is removed and a new patterned masking layer 146 is formed upon the implant oxide 122 to protect the previously formed implanted N+ layer 144 and to expose a second region of the P– substrate 120. A boron implant 148 is next performed into the semiconductor body as shown in FIG. 4B. The patterned masking layer 146 is thick enough to block the penetration of boron into regions of the semiconductor body disposed below the patterned masking layer 146. The resulting structure is shown in FIG. 4C, and includes an implanted P+ layer 150 formed below the top surface of the P– substrate 120 and laterally adjacent to the implanted N+ layer 144. The implanted P+ layer 150 is formed only within regions of the P– substrate 120 not protected by the patterned masking layer 146, and is thus also discontinuous across the semiconductor body. The implanted P+ layer 150 and the implanted N+ layer 144 may also be formed to horizontally overlap, or at different depths.

Figure 4D:
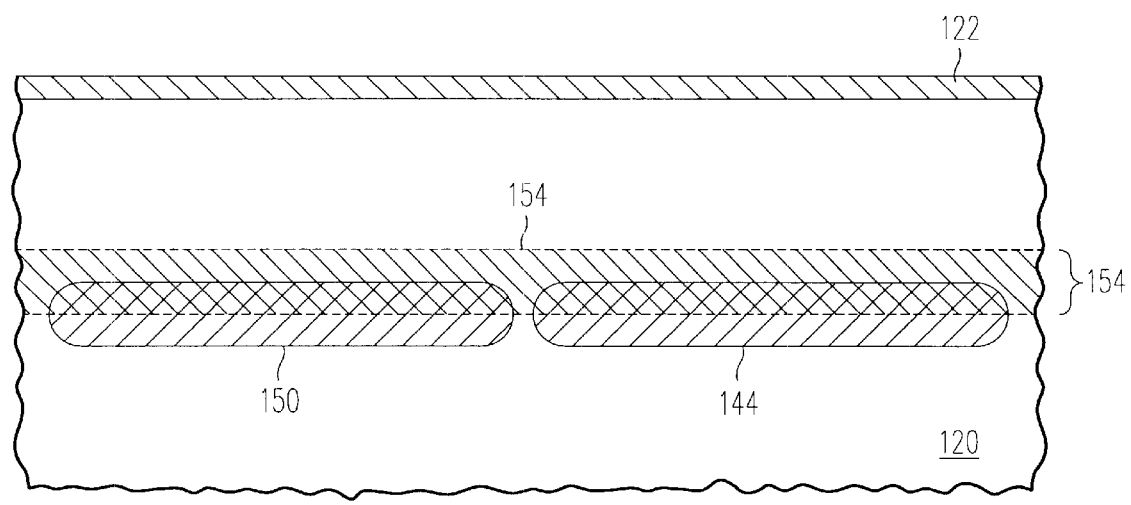

Continuing with the process sequence, a nitrogen implant 152 is next performed into the semiconductor body as shown in FIG. 4C. The resulting structure is shown in FIG. 4D, and includes a nitrogen barrier layer 154 formed, for this embodiment, in close proximity to the upper boundary of the implanted N+ layer 144 and the implanted P+ layer 150. The nitrogen barrier layer 154 may be formed as a continuous layer across the semiconductor body, as shown. The nitrogen barrier layer 154 may alternatively be formed at any of a variety of different depths. For example, the nitrogen barrier layer 154 may reside completely within the implanted P+ layer 150, may reside partially between the top surface and the implanted P+ layer 150 and partially within the implanted P+ layer 150 (as shown in FIG. 4D), or may reside completely between the top surface and the implanted P+ layer 150 (above the implanted P+ layer 150). As before, the nitrogen implant 152 may alternatively be performed without an implant oxide 122.

Each of the arsenic implant 142, the boron implant 148, and the nitrogen implant 152 may be performed after formation of an implant oxide 122 (as shown), or may alternatively be performed after formation of field regions, after deposition of gate material, after formation of the gate electrodes, or after formation of the source/drain regions. The nitrogen implant 152 may alternatively precede the boron implant 148 and the arsenic implant 142. Each of the three implants (arsenic implant 142, boron implant 148, and nitrogen implant 152) may be performed in any relative order. Moreover, the nitrogen implant 152 may be performed early in the process flow (such as after formation of the implant oxide 122) and the boron implant 148 performed much later in the process flow, such as after formation of the source/drain regions.

Continuing with the process sequence, an anneal is next performed to repair lattice damage caused by the arsenic implant 142, the boron implant 148, and the nitrogen implant 152. Such an anneal is preferably performed using rapid thermal processing (RTP) and may be performed at a temperature in the range of 850–1200° C. for a time duration in the range of 10–60 seconds. Alternatively, a furnace anneal may also be employed.

The nitrogen barrier layer 154 serves to retard upward diffusion of both the boron from the implanted P+ layer 150 and the arsenic from the implanted N+ layer 144. If the boron implant 148 is performed after the formation of source/drain regions, including the high temperature anneal for the source/drain regions, then boron upward diffusion from the implanted P+ layer 150 will be reduced because the boron will not have even been present within the P– substrate 120 during many of the high temperature processing steps necessary for transistor formation.

Figure 5:
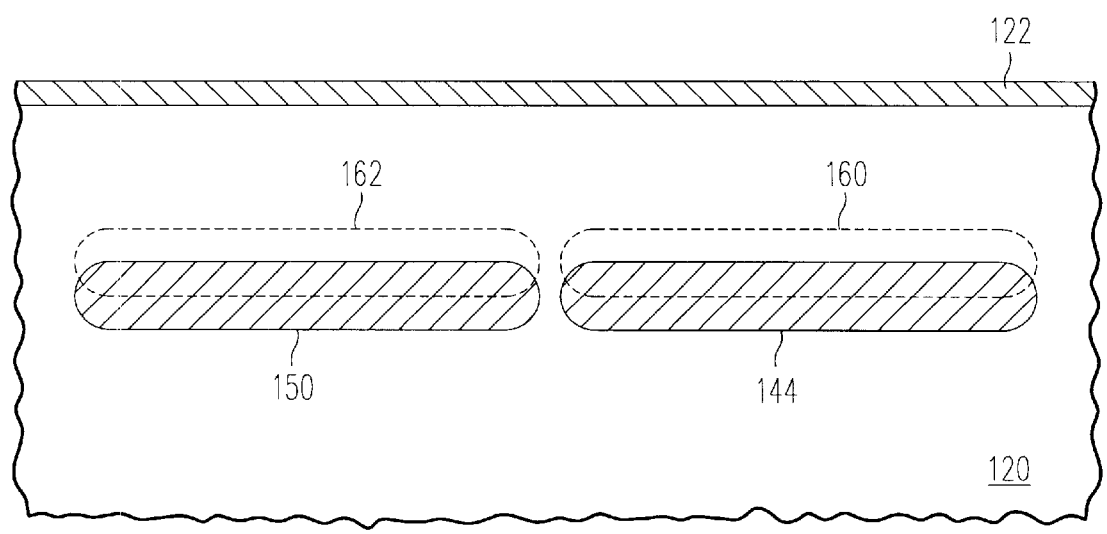
FIG. 5 is a cross-sectional view of a particular structure in a semiconductor process flow in accordance with another embodiment of the current invention.

A variation of the embodiment illustrated in FIGS. 4A–4D is shown in FIG. 5, in which a selective nitrogen implant is used to form a diffusion barrier layer for an underlying P+ layer, and a selective oxygen implant is used to form a diffusion barrier layer for an underlying N+ layer within a semiconductor substrate. Referring to FIG. 5, a semiconductor body includes a P– substrate 120, and an implant oxide 122, as before. An implanted N+ layer 144 and an implanted P+ layer 150 are also shown as described in the process of FIGS. 4A–4D.

A nitrogen barrier layer 162 is formed as a discontinuous layer (using a masking layer as described above) in close proximity to the upper boundary of the implanted P+ layer 150. In addition, an oxygen-rich barrier layer 160 is formed as a discontinuous layer (using a masking layer as described above) in close proximity to the upper boundary of the implanted N+ layer 144. Each of the nitrogen barrier layer 162 and oxygen-rich barrier layer 160 functions as a barrier layer to retard the upward diffusion of dopant from the underlying implanted P+ layer 150 and implanted N+ layer 144, respectively. Such an arsenic implanted N+ layer 144 is preferably formed within N-well regions and not P-well regions.

Figure 6:
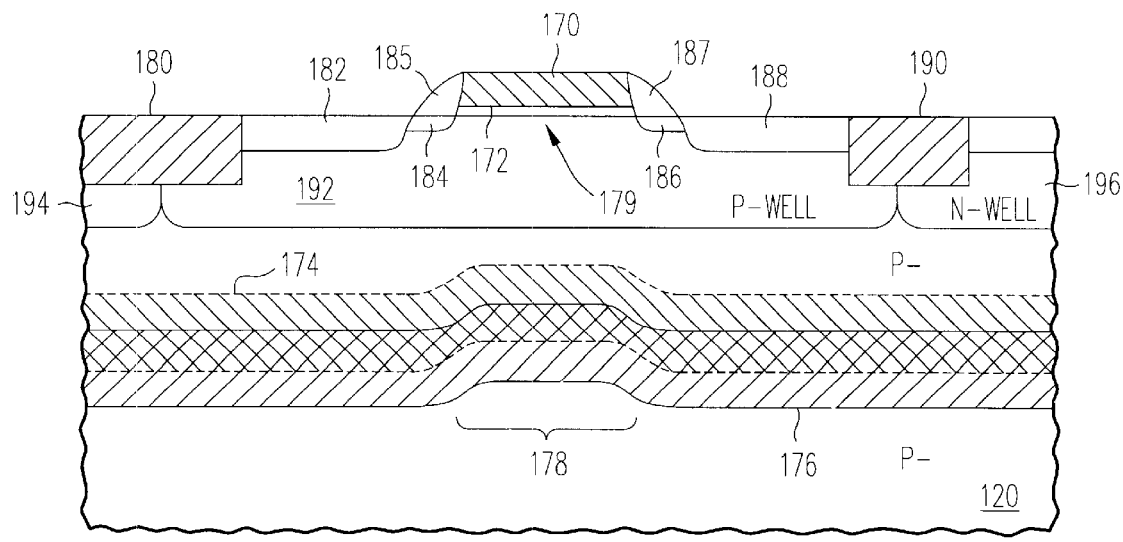
FIG. 6 is a cross-sectional view of a particular structure in a semiconductor process flow in accordance with another embodiment of the current invention.

An additional embodiment is illustrated in FIG. 6, which is similar to the embodiment shown in FIGS. 3A–3C, but where the implantation of boron and nitrogen are performed after the formation of a gate electrode over the semiconductor body. A boron implant (not shown) is used to form implanted boron P+ layer 176 and a nitrogen implant (not shown) is performed to form a nitrogen barrier layer 174, as described in reference to FIGS. 3A–3C. But because the two implants are performed after the formation of gate electrode 170, a portion of the nitrogen barrier layer 174 disposed beneath the gate electrode 170 (e.g., within region 178) lies closer to the top surface 179 than do remaining portions of the nitrogen barrier layer 174. Likewise, a portion of the implanted boron P+ layer 176 disposed beneath the gate electrode 170 (within region 178) lies closer to the top surface 179 than do remaining portions of the implanted boron P+ layer 176.

Also shown in FIG. 6 are additional structures forming an IGFET transistor, including isolation regions 180 and 190, source/drain regions 182 and 188, lightly-doped drain (LDD) regions 184 and 186, sidewall spacers 185 and 187, P-well region 192, N-well regions 194 and 196, and gate dielectric 172. The gate dielectric 172 may be formed to a thickness in the range of 25–200 Å, and may be formed of a silicon oxide, a silicon oxynitride, a silicon nitride, or any other suitable insulating material which may be formed of an appropriate thickness. The polysilicon gate electrode 170 may be 500–3000 Å thick (with 2000 Å preferred) and is shown formed upon the gate dielectric 172. The isolation regions 180 and 190 preferably extend from the top surface 179 down to a depth of 0.3 microns. The P-well region 192 and the N-well regions 194 and 196 preferably extend from the top surface 179 down to a depth in the range of 0.5–1.0 microns. The source/drain regions 182 and 188 preferably extend from the top surface 179 down to a depth in the range of 0.1–0.2 microns. Formation of each of these structures and regions is well known in the art, and will not be discussed in detail. Of note, the depth of the nitrogen barrier layer 174, preferably in the range from 1–5 microns, is well below the source/drain regions 182 and 188, to more effectively retard the upward diffusion of boron from the implanted boron P+ layer 176 toward the transistor.

This invention, in its many embodiments, is well suited to the manufacture of integrated circuits, including microprocessor integrated circuits, and systems incorporating such microprocessor integrated circuits and having a system bus coupled to an external memory subsystem.

While the invention has been largely described with respect to the embodiments set forth above, the invention is not necessarily limited to these embodiments. For example, the implant steps described above may be performed in various sequential order, each after various steps within the process flow. Many of these variations are described above in detail, but others are not. Moreover, each of the implants may be performed selectively or non-selectively, using various combinations of arsenic, boron, oxygen, and nitrogen. The boron implant step may utilize B, BF, BF$_2$, or any other source containing boron atoms, and the nitrogen implant step may utilize atomic nitrogen (N), molecular nitrogen (N$_2$), or any other source containing nitrogen atoms. A given implant may be restricted to forming a corresponding layer within a certain well region (for example, such as a P-well) and excluding other well regions (for example, such as an N-well). Each of these layers may be formed using two different implant operations, each at a different energy, to achieve a wider layer than using a single implant (analogously to that shown in FIG. 7 for nitrogen). For example, a P+ layer may be formed using two different boron implant operations, each at a different energy. These two boron implants may be performed in either order, and could be performed at different points in the process flow. For example, the deeper implant may be performed early in the process flow, while the shallower implant may be performed much later. Accordingly, other embodiments, variations, and improvements not described herein are not necessarily excluded from the scope of the invention, which is defined by the following appended claims.

What is claimed is:

1. In a semiconductor process, a method of retarding upward diffusion of a dopant within a semiconductor body, said method comprising the steps of:

providing a semiconductor body having a top surface and a heavily-doped layer beneath and separated from the top surface, said heavily-doped layer including a first dopant;

forming a transistor gate electrode over the semiconductor body;

forming a transistor source/drain region within the semiconductor body; and implanting a material through a top portion of the semiconductor body to form a barrier layer of said material beneath and separated from the top surface and at a greater depth than the source/drain region, for retarding the upward diffusion of said first dopant.

2. A method as in claim 1 wherein the providing step further comprises:

providing the semiconductor body with a lightly-doped epitaxial layer between the top surface and the heavily-doped layer.

3. A method as in claim 1 wherein the heavily-doped layer comprises:

an implanted layer of the first dopant.

4. A method as in claim 1 wherein the barrier layer implanting step is performed before the gate electrode forming step.

5. A method as in claim 1 wherein the barrier layer implanting step is performed after the gate electrode forming step.

6. A method as in claim 1 wherein the barrier layer implanting step is performed before the source/drain region forming step.

7. A method as in claim 1 wherein the barrier layer implanting step is performed after the source/drain region forming step.

8. A method as in claim 1 wherein the heavily-doped layer comprises an N+ layer.

9. A method as in claim 1 wherein the heavily-doped layer comprises an P+ layer.

10. A method as in claim 1 wherein:

the barrier layer resides substantially within the heavily-doped layer.

11. A method as in claim 1 wherein:

the barrier layer resides partially within the heavily-doped layer and partially between the heavily-doped layer and the top surface.

12. A method as in claim 1 wherein:

the barrier layer resides substantially between the heavily-doped layer and the top surface.

13. A method as in claim 1 wherein:
the barrier layer implanting step is performed non-selectively into the semiconductor body, so that the barrier layer is continuous across the semiconductor body.

14. A method as in claim 1 wherein:
the barrier layer implanting step is performed selectively into certain regions of the semiconductor body, so that the barrier layer is discontinuous across the semiconductor body.

15. A method as in claim 1 wherein the material comprises nitrogen.

16. A method as in claim 1 wherein the material comprises oxygen.

17. In a semiconductor process, a method of retarding upward diffusion of a dopant within a semiconductor body, said method comprising the steps of:
providing a semiconductor body having a top surface and a heavily-doped P+ layer beneath and separated from the top surface, said heavily-doped P+ layer including boron and having an upper boundary;
forming a transistor gate electrode over the semiconductor body;
forming a transistor source/drain region within the semiconductor body; and
implanting nitrogen into the semiconductor body to form a nitrogen barrier layer beneath and separated from the top surface and at a greater depth than the source/drain region, said barrier layer in proximity with the upper boundary for retarding the upward diffusion of boron from the heavily-doped P+ layer.

18. A method as in claim 17 wherein:
the semiconductor body includes a lightly-doped epitaxial layer between the top surface and the heavily-doped P+ layer; and
the nitrogen implanting step is performed non-selectively as a blanket implant into the semiconductor body, so that the barrier layer formed is continuous across the semiconductor body.

19. A method as in claim 17 wherein:
the heavily-doped P+ layer comprises an implanted layer of boron; and
the nitrogen implanting step is performed non-selectively as a blanket implant into the semiconductor body, so that the barrier layer formed is continuous across the semiconductor body.

20. A method as in claim 17 wherein:
the semiconductor body includes a lightly-doped epitaxial layer between the top surface and the heavily-doped P+ layer; and
the nitrogen implanting step is performed selectively into certain regions of the semiconductor body, so that the barrier layer formed is discontinuous across the semiconductor body.

21. A method as in claim 17 wherein:
the heavily-doped P+ layer comprises an implanted layer of boron; and
the nitrogen implanting step is performed selectively into certain regions of the semiconductor body, so that the barrier layer formed is discontinuous across the semiconductor body.

22. A method as in claim 18 wherein:
the nitrogen implanting step is performed after the gate electrode forming step; and
the barrier layer includes a region located beneath the gate electrode that is spaced closer to the top surface of the semiconductor body than are remaining regions of the barrier layer to the top surface.

23. A method as in claim 18 wherein:
the nitrogen implanting step is performed at an energy in the range of 1–3 MeV; and
the barrier layer is formed at a depth in the range of 1–5 microns from the top surface.

24. A method as in claim 19 wherein:
the nitrogen implanting step is performed at an energy in the range of 1–3 MeV; and
the barrier layer is formed at a depth in the range of 1–5 microns from the top surface.

25. A method as in claim 20 wherein: the certain regions comprise well regions of a first conductivity type and exclude well regions of a second conductivity type.

26. A method as in claim 20 wherein:
the certain regions comprise well regions of a first conductivity type and exclude well regions of a second conductivity type.

27. A method as in claim 25 wherein:
the well regions of a first conductivity type comprise N-well regions.

28. In a semiconductor process, a method of retarding upward diffusion of boron within a semiconductor body, said method comprising the steps of:
providing a semiconductor body having a top surface;
forming a transistor gate electrode over the semiconductor body;
forming a transistor source/drain region within the semiconductor body;
implanting a P-type dopant into the semiconductor body to form a heavily-doped P+ layer beneath and separated from the top surface and at a greater depth than the source/drain region;
implanting nitrogen into the semiconductor body to form a barrier layer beneath and separated from the top surface and at a greater depth than the source/drain region, said barrier layer for retarding the upward diffusion of dopant forming the heavily-doped P+ layer; and
annealing the semiconductor body after both implanting steps.

29. A method as in claim 28 wherein:
the nitrogen implanting step is performed non-selectively as a blanket implant into the semiconductor body, so that the barrier layer is continuous across the semiconductor body; and
the P-type dopant implanting step is performed non-selectively as a blanket implant into the semiconductor body, so that the heavily-doped P+ layer is continuous across the semiconductor body.

30. A method as in claim 29 wherein:
the nitrogen implanting step is performed at an energy in the range of 1–3 MeV; and
the nitrogen barrier layer is formed at a depth in the range of 1–5 microns from the top surface.

31. A method as in claim 29 wherein:
the implanting steps are both performed after the source/drain region forming step.

32. A method as in claim 31 wherein:
the barrier layer includes a region located beneath the gate electrode that is spaced closer to the top surface of the semiconductor body than are remaining regions of the barrier layer to the top surface.

33. A method as in claim 32 wherein:

the heavily-doped P+ layer includes a region located beneath the gate electrode that is spaced closer to the top surface of the semiconductor body than are remaining regions of the heavily-doped P+ layer to the top surface.

34. A method as in claim 28 wherein the P-type dopant implanting step comprises:

a first implantation operation using a first acceleration energy; and a second implantation operation using a second acceleration energy greater than the first acceleration energy.

35. A method as in claim 28 wherein the nitrogen implanting step comprises:

a first implantation operation using a first acceleration energy; and a second implantation operation using a second acceleration energy greater than the first acceleration energy.

36. A method as in claim 28 wherein the nitrogen implanting step comprises:

an implantation operation using a source of nitrogen chosen from the group consisting of atomic nitrogen (N) and molecular nitrogen ($N_2$).

37. A method as in claim 28 wherein:

the P-type dopant implanting step comprises a boron implantation operation using a source of boron chosen from the group consisting of B, BF, and $BF_2$.

* * * * *

UNITED STATES PATENT AND TRADEMARK OFFICE
CERTIFICATE OF CORRECTION

PATENT NO. : 6,410,409 B1
DATED : June 25, 2002
INVENTOR(S) : Mark I. Gardner et al.

It is certified that error appears in the above-identified patent and that said Letters Patent is hereby corrected as shown below:

Column 12,
Line 18, please replace "20" with -- 21 --.

Signed and Sealed this

First Day of April, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,410,409 B1 Page 1 of 1
APPLICATION NO. : 08/741799
DATED : June 25, 2002
INVENTOR(S) : Gardner et al.

It is certified that error appears in the above-identified patent and that said Letters Patent is hereby corrected as shown below:

On the title page,
(*) delete "0" and insert --808--.

Signed and Sealed this

Sixth Day of February, 2007

JON W. DUDAS
*Director of the United States Patent and Trademark Office*